(12) United States Patent
Dirksen et al.

(10) Patent No.: US 6,331,368 B2
(45) Date of Patent: Dec. 18, 2001

(54) TEST OBJECT FOR USE IN DETECTING ABERRATIONS OF AN OPTICAL IMAGING SYSTEM

(75) Inventors: Peter Dirksen; Casparus A. H. Juffermans, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/844,122

(22) Filed: Apr. 27, 2001

Related U.S. Application Data

(62) Division of application No. 09/407,532, filed on Sep. 29, 1999, now Pat. No. 6,248,486.

(30) Foreign Application Priority Data

Nov. 23, 1998 (EP) .................................................. 98203945

(51) Int. Cl.[7] .......................................................... G03F 8/00
(52) U.S. Cl. .................................................. 430/5; 430/17
(58) Field of Search ..................... 430/5, 17, 30

(56) References Cited

U.S. PATENT DOCUMENTS

| | | | |
|---|---|---|---|
| 4,251,160 | * | 2/1981 | Bouwhuis et al. .................... 356/401 |
| 4,356,392 | * | 10/1982 | Wittekock et al. ................... 250/201 |
| 4,737,823 | * | 4/1988 | Bouwer et al. ......................... 355/53 |
| 5,191,200 | * | 3/1993 | Van Der Werf et al. ......... 250/201.4 |
| 5,217,831 | * | 6/1993 | White ....................................... 430/5 |
| 5,367,404 | * | 11/1994 | Hayata .................................. 359/558 |
| 5,776,645 | * | 7/1998 | Barr et al. ............................... 430/22 |

FOREIGN PATENT DOCUMENTS

| | | | |
|---|---|---|---|
| 0498499B1 | * | 8/1992 | (EP) . |
| 0658810A1 | * | 6/1995 | (EP) . |
| 0779528A2 | * | 6/1997 | (EP) . |
| 0849638A2 | * | 6/1998 | (EP) . |

OTHER PUBLICATIONS

"Photolithography Using the Aerial Illuminator in a Variable NA Wafer Stepper ", R. Rogoff et al., SPIE vol. 2726 pp. 54–70.*

* cited by examiner

Primary Examiner—Christopher G. Young
(74) Attorney, Agent, or Firm—Steven R. Biren

(57) ABSTRACT

Aberrations of an imaging system (PL) can be detected in an accurate and reliable way by imaging, by means of the imaging system, a test object having circular phase structure (22) on a photoresist (PR), developing the resis and scanning it with a scanning detection device (SEM) which is coupled to an image processor (IP). The circular phase structure is imaged in a ring structure (25) and each of several possible aberrations, like coma, astigmatism, three-point aberration, etc. causes a specific change in the shape of the inner contour (CI) and the outer contour (CE) of the ring and/or a change in the distance between these contours, so that the aberrations can be detected independently of each other.

7 Claims, 15 Drawing Sheets

TEST OBJECT FOR USE IN DETECTING ABERRATIONS OF AN OPTICAL IMAGING SYSTEM

CROSS REFERENCE TO RELATED APPLICATIONS

This is a divisional of application Ser. No. 09/407,532 filed Sep. 29, 1999 now U.S. Pat. No. 6,248,486.

BACKGROUND OF THE INVENTION

The invention relates to a method of detecting aberrations of an optical image system, comprising the steps of:

arranging a test object in the object plane of the system;

providing a photoresist layer in the image plane of the system;

imaging the test object by means of the system and an imaging beam;

developing the photoresist layer, and detecting the developed image by means of a scanning detection device having a resolution which is considerably larger than that of the imaging system.

The fact that the resolution of the scanning detection device is considerably larger than that of the imaging system means that the detection device allows observation of details which are considerably smaller than the details that can still be separately imaged by the imaging system.

An optical imaging system in the form of a projection lens system having a large number of lens elements is used in photolithographic projection apparatuses which are known as wafer steppers or as wafer step-and-scanners. Such apparatuses are used, inter alia, for manufacturing integrated circuits, or ICs. In a photolithographic projection apparatus, a mask pattern present in the mask is imaged a large number of times, each time on a different area (IC area) of the substrate by means of a projection beam having a wavelength of, for example, 365 nm in the UV range, or a wavelength of, for example, 248 nm in the deep UV range, and by means of the projection lens system.

The method mentioned above is known from the opening paragraph of EP-A 0 849 638, relating to a method of measuring the comatic aberration of projection lens systems in lithographic projection apparatuses.

The aim is to integrate an ever-increasing number of electronic components in an IC. To realize this, it is desirable to increase the surface area of an IC and to decrease the size of the components. For the projection lens system, this means that both the image field and the resolution must be increased, so that increasingly smaller details, or line widths, can be imaged in a well-defined way in an increasingly larger image field. This requires a projection lens system which must comply with very stringent quality requirements. Despite the great care with which such a projection lens system has been designed and the great extent of accuracy with which the system is manufactured, such a system may still exhibit aberrations such as spherical aberration, coma and astigmatism which are not admissible for the envisaged application. In practice, a lithographic projection lens system is thus not an ideal, diffraction-limited system but an aberration-limited system. Said aberrations are dependent on the positions in the image field and are an important source of variations of the imaged line widths occurring across the image field. When novel techniques are used to enhance the resolving power, or the resolution, of a lithographic projection apparatus, such as the use of phase-shifting masks, as described in, for example, U.S. Pat. No. 5,217,831, or when applying an off-axis illumination as described in, for example, U.S. Pat. No. 5,367,404, the influence of the aberrations on the imaged line widths still increases.

Moreover, the aberrations are not constant in modem lithographic projection lens systems. To minimize low-order aberrations, such as distortion, curvature of the field, astigmatism, coma and spherical aberration, these systems comprise one or more movable lens elements. The wavelength of the projection beam or the height of the mask table may be adjustable for the same purpose. When these adjusting facilities are used, other and smaller aberrations are introduced. Moreover, since the intensity of the projection beam must be as large as possible, lithographic projection lens systems are subject to aging so that the extent of the aberrations may change with respect to time.

Based on the considerations described above, there is an increasing need for a reliable and accurate method of measuring aberrations.

It has also been proposed to use for the projection beam a beam of extreme UV (EUV) radiation, i.e. radiation at a wavelength in the range of several nm to several tens of nm. The resolution of the projection lens system can thereby be enhanced considerably without increasing the numerical aperture (NA) of the system. Since no suitable lens material is available for EUV radiation, a mirror projection system instead of a lens projection system must then be used. A lithographic mirror projection system is described in, inter alia, EP-A 0 779 258. For reasons analogous to those for the lens projection system, there is a need for an accurate and reliable method of measuring aberrations for this EUV mirror projection system as well.

The opening paragraph of said EP-A 0 849 638 rejects the method in which the image of a test mask formed in the photoresist layer is scanned with a scanning detection device in the form of a scanning electron microscope. Instead, it is proposed to detect said image with optical means. To this end, a test mask having one or more patterns of strips which are alternately radiation-transmissive and radiation-obstructive, i.e. an amplitude structure, is used. The comatic aberration of a projection system can be detected with such a pattern. The detection is based on measuring the widths of the light or dark strips in the image formed and/or measuring the asymmetry between the strips at the ends of the image of the patterns.

SUMMARY OF THE INVENTION

It is an object of the present invention to provide a method of the type descrobed on the opening paragraph, which is based on a different principle and with which different aberrations can be measure independently of each other. This method is characterized in that use is made of a test object which comprises at least one closed single figure having a phase structure, and in that the image of this figure observed by the scanning detection device is subjected to an image analysis in order to ascertain at least one of different types of changes of shape in the image of the single figure, each type of shape change being indicative of a given kind of aberration.

A single figure is understood to mean a figure having a single contour line which is closed in itself. The contour line is the boundary line between the figure and its ambience.

The invention is based on the recognition that the contour line of a figure having a phase structure is not imaged in a single line but in a first and a second image line, the second image line being located within the first image line, and the distance between the first and the second image line is determined by the point spread function, or Airy distribution, of the imaging system. In the method according to the invention, useful use is thus made of the point spread function, or Airy distribution, of the imaging system. If this system has given aberrations, given deviations of the ideal image occur, such as deviations of the shape of the image lines themselves and/or changes of the mutual position of the two image lines. The novel method thus allows detection of aberrations which cannot be detected when using a test object in the form of an amplitude, or black-white, structure. When using a test object with an amplitude structure, its contour line is imaged in a single line. Consequently, only the aberrations of the imaging system which cause deviations of the imaged single contour line can be detected when using such a test object, and this even less accurately. When using a test object having a phase structure, different aberrations occurring simultaneously can be detected separately because the effects of the different aberrations remain well distinguishable in the image formed, in other words, the different aberrations do not exhibit any mutual crosstalk.

It is to be noted that, in one embodiment described in U.S. Pat. No. 5,754,299, relating to a method and a device for measuring an asymmetrical aberration of a lithographic projection system, the test object is denoted as phase pattern. However, this pattern is not a closed single figure, but a phase grating, for example, an alignment mark. The image formed of this grating has the same appearance as the grating itself, i.e. each grating line is imaged in a single line. Moreover, for measuring the aberration, an image of the grating is formed every time at different focus settings, and the detection is based on measuring the asymmetries between these images, rather than on detecting changes of shape and/or positions in an image itself.

The method is further preferably characterized in that a scanning electron microscope is used as a scanning detection device.

Such a microscope which is already frequently used in practice has a sufficient resolution for this application. Another and newer type of scanning detection device is the scanning probe microscope which is available in several implementations such as the atomic force microscope (AFM) and the scanning optical probe microscope.

The method is further preferably also characterized in that the image analysis method used comprises a Fourier analysis.

Since the Fourier analysis operates with sine and cosine functions, it is eminently suitable to directly analyze the contour lines of the image.

The phase structure of the test object may be realized in various ways. For example, the single figure may be constituted by an area in a transparent plate having a refractive index which is different from that of the rest of the plate.

A preferred embodiment of the novel method is characterized in that every single figure is constituted by an area in a plate located at a different height than the rest of said plate.

Said area may be countersunk in the plate or project from the plate. This plate may be transparent to the radiation of the imaging beam, or reflective.

The single figure may have various shapes, such as the shape of square or of a triangle. A preferred embodiment of the novel method is characterized in that said area is circularly shaped.

The shape of the single figure is then optimally adapted to the circular symmetry of the imaging system, and the image of this figure consists of two circular image lines. A change of the shape and a mutual offset of these image lines can be observed easily. Even if a square single figure is used, the novel method yields good results because the image lines of this figure formed by the projection system are a sufficient approximation of the circular shape.

Each single figure is preferably further characterized in that the height difference between the area of this figure and the rest of the plate is such that a phase difference of 180° is introduced in the imaging beam.

For a transmissive, or reflective, test object, this means that the height difference must be of the order of $\lambda/(2(n_2-n_1))$, or of $\lambda/4n$, in which $\lambda$ is the wavelength of the imaging beam, $n_2$ is the refractive index of the material of the test object and $n_1$ is the refractive index of the surrounding medium. At this height difference, the phase difference between the part of the imaging beam originating from the area of the single figure and the part of the imaging beam originating from the surroundings of this area is maximal, and the contrast in the image formed is maximal. If the diameter of the area is of the order of the wavelength of the imaging beam, or of a larger order, the optimal height difference is equal to $\lambda/(2(n_2-n_1))$ or $\lambda/4n$. At a smaller diameter, polarization effects must be taken into account, and the optimal height difference deviates by several percent from the last-mentioned values.

In accordance with a further preferred embodiment, the diameter of the area is proportional to $\lambda/(NA.M)$, in which $\lambda$ is the wavelength of the imaging beam, NA is the numerical aperture of the projection system at the image side and M is the magnification of this system.

The size of the test object is then adapted to the resolution of the projection system, allowing measurements of aberrations of the smallest images that can be made with the projection system.

The method may be used, inter alia, for detecting aberrations of a projection system in a lithographic apparatus intended to image a mask pattern, present in a production mask, on a production substrate which is provided with a photoresist layer. This method is further characterized in that a mask having at least a single figure with a phase structure is used as a test object, which mask is arranged at the position of a production mask in the projection apparatus, and in that a photoresist layer with a support is provided at the position of a production substrate.

This method provides the advantage that aberrations of the projection system can be detected under circumstances which correspond to those for which this projection system is intended. The number of single figures may vary from one to several tens. Since these figures are imaged at different positions within the image field of the projection system, insight is obtained into the variations of the aberrations across the image field. Since the single figures are small, they may be provided in the production mask at positions outside the details of the mask pattern.

However, the method is preferably further characterized in that use is made of an empty test mask having at least a single figure.

The test object is now constituted by a recessed or a raised part of a transparent plate of the same material and having the same thickness as a production mask, but without a mask pattern or parts thereof, which plate may be denoted as empty test mask.

The invention further relates to a system for performing the method described above. The system comprises an optical apparatus of which the imaging system forms part, a test object having at least a single figure with a phase structure, a scanning detection device for scanning at least a test object image formed by the imaging system, and an image processor, coupled to the scanning projection device, for storing and analyzing the observed images, and is characterized in that the image processor comprises analysis means for detecting at least one of different types of changes of the shape of said image.

The invention also relates to a lithographic projection apparatus for imaging a mask pattern, present in a mask, on a substrate, which apparatus comprises an illumination unit for supplying a projection beam, a mask holder for accommodating the mask, a substrate holder for accommodating the substrate, and a projection system arranged between the mask holder and the substrate holder, which apparatus is suitable for performing the method described above. This apparatus is characterized in that, in the implementation of the method, the projection beam is used as an imaging beam, and in that the illumination unit comprises means for reducing the diameter of the projection beam cross-section for the method to a value which is smaller than the diameter of the projection beam cross-section during projection of the mask pattern on the substrate.

The invention further relates to a test object for use with the method described above. This test object has one or more of the characteristic features of the above-mentioned embodiments of the method relating to the test object.

This test object may further have the characteristic features as claimed in claims 12–17.

These and other aspects of the invention are apparent from and will be elucidated, by way of non-limitative example, with reference to the embodiments described hereinafter.

DESCRIPTION OF THE PREFERRED EMBODIMENT

Figure 1:
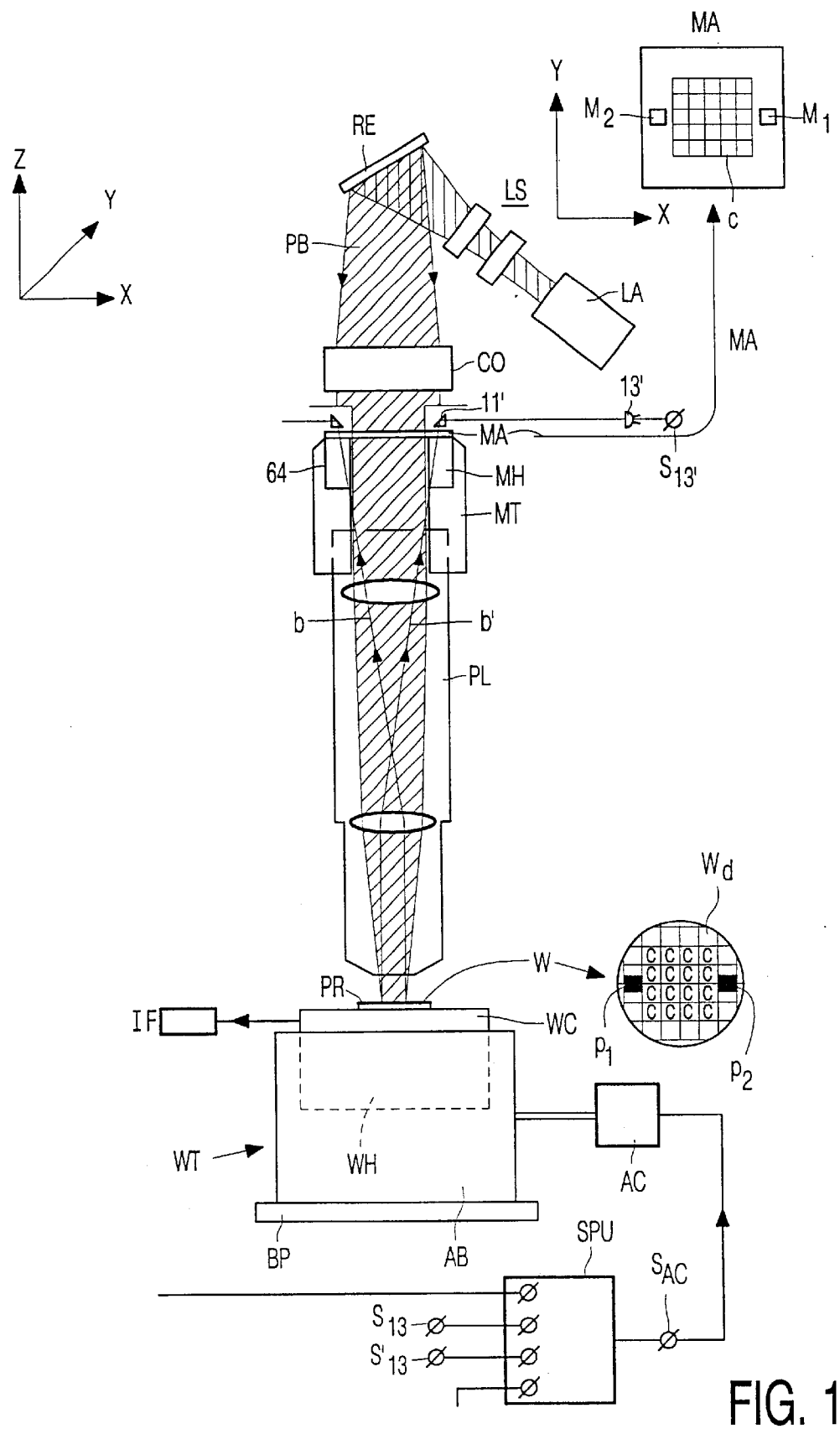
FIG. 1 shows diagrammatically an embodiment of a photolithographic projection apparatus with which the method can be performed.

FIG. 1 only shows diagrammatically the most important optical elements of an embodiment of a lithographic apparatus for repetitively imaging a mask pattern on a substrate. This apparatus comprises a projection column accommodating a projection lens system PL. Arranged above this system is a mask holder MH for accommodating a mask MA in which the mask pattern C, for example, an IC pattern to be imaged is provided. The mask holder is present in a mask table MT. A substrate table WT is arranged under the projection lens system PL in the projection column. This substrate table supports the substrate holder WH for accommodating a substrate W, for example, a semiconductor substrate, also referred to as wafer. This substrate is provided with a radiation-sensitive layer PR, for example a photoresist layer, on which the mask pattern must be imaged a number of times, each time in a different IC area Wd. The substrate table is movable in the X and Y directions so that, after imaging the mask pattern on an IC area, a subsequent IC area can be positioned under the mask pattern.

The apparatus further comprises an illumination system which is provided with a radiation source LA, for example, a krypton-fluoride excimer laser or a mercury lamp, a lens system LS, a reflector RE and a condenser lens CO. The projection beam PB supplied by the illumination system illuminates the mask pattern C. This pattern is imaged by the projection lens system PL on an IC area of the substrate W. The illumination system may be implemented as described in EP-A 0 658 810. The projection system has, for example, a magnification M=¼, a numerical aperture NA=0.6 and a diffraction-limited image field with a diameter of 22 mm.

The apparatus is further provided with a plurality of measuring systems, namely an alignment system for aligning the mask MA and the substrate W with respect to each other in the XY plane, an interferometer system for determining the X and Y positions and the orientation of the substrate holder and hence of the substrate, and a focus error detection system for determining a deviation between the focal or image plane of the projection lens system PL and the surface of the photoresist layer PR on the substrate W. These measuring systems are parts of servosystems which comprise electronic signal-processing and control circuits and drivers, or actuators, with which the position and orientation of the substrate and the focusing can be corrected with reference to the signals supplied by the measuring systems.

The alignment system uses two alignment marks $M_1$ and $M_2$ in the mask MA, denoted in the top right part of FIG. 1. These marks preferably consist of diffraction gratings but may be alternatively constituted by other marks such as squares or strips which are optically different from their surroundings. The alignment marks are preferably two-dimensional, i.e. they extend in two mutually perpendicular directions, the X and Y directions in FIG. 1. The substrate W has at least two alignment marks, preferably also two-dimensional diffraction gratings, two of which, $P_1$ and $P_2$, are shown in FIG. 1. The marks $P_1$ and $P_2$ are located outside the area of the substrate W where the images of the pattern C must be formed. The grating marks $P_1$ and $P_2$ are preferably implemented as phase gratings, and the grating marks $M_1$ and $M_2$ are preferably implemented as amplitude gratings. The alignment system may be a double alignment system in which two alignment beams b and b' are used for imaging the substrate alignment mark $P_2$ and the mask alignment mark $M_2$, or the substrate alignment mark $P_1$ and the mask alignment mark $M_1$ on each other. After they have passed the alignment system, the alignment beams are received by a radiation-sensitive detector 13, or 13', which converts the relevant beam into an electric signal which is indicative of the extent to which the substrate marks are aligned with respect to the mask marks, and thus the substrate is aligned with respect to the mask. A double alignment system is described in U.S. Pat. No. 4,778,275 which is referred to for further details of this system.

For an accurate determination of the X and Y positions of the substrate, a lithographic apparatus is provided with a multi-axis interferometer system which is diagrammatically shown by way of the block IF in FIG. 1. A two-axis interferometer system is described in U.S. Pat. No. 4,251,160, and a three-axis system is described in U.S. Pat. No. 4,737,823. A five-axis interferometer system is described in EP-A 0 498 499, with which both the displacements of the substrate along the X and Y axes and the rotation about the Z axis and the tilts about the X and Y axes can be measured very accurately.

A step-and-scan lithographic apparatus does not only comprise a substrate interferometer system but also a mask interferometer system.

As is diagrammatically shown in FIG. 1, the output signal Si of the interferometer system and the signals $S_{13}$ and $S'_{13}$ of the alignment system are applied to a signal-processing unit SPU, for example, a microcomputer which processes said signals to control signals $S_{AC}$ for an actuator AC with which the substrate holder is moved, via the substrate table WT, in the XY plane.

The projection apparatus further comprises a focus error detection device, not shown in FIG. 1, for detecting a deviation between the focal plane and the projection lens system PL and the plane of the photoresist layer PR. Such a deviation may be corrected by moving, for example, the lens system and the substrate with respect to each other in the Z direction or by moving one or more lens elements of the projection lens system in the Z direction. Such a detection device which may be secured, for example, to the projection lens system, is described in U.S. Pat. No. 4,356,392. A detection device with which both a focus error and a local tilt of the substrate can be detected is described in U.S. Pat. No. 5,191,200.

Very stringent requirements are imposed on the projection lens system. Details having a line width of, for example 0.35 μm or smaller should still be sharply imaged with this system, so that the system must have a relatively large NA, for example, 0.6. Moreover, this system must have a relatively large, well-corrected image field, for example, with a diameter of 23 mm. To be able to comply with these stringent requirements, the projection lens system comprises a large number, for example, tens of lens elements, and the lens elements must be made very accurately and the system must be assembled very accurately. A good control of the projection system is then indispensable, both for determining whether the system is sufficiently free from aberrations and is suitable to be built into the projection apparatus, and to be able to ascertain whether aberrations may as yet occur due to all kinds of causes so that measures can be taken to compensate for these aberrations.

For detecting the aberrations, the projection apparatus itself may be used as a part of a measuring system for performing a detection method. In accordance with this method, a test mask having a given test pattern is arranged in the mask holder, and this test pattern is imaged in the radiation-sensitive, or photoresist, layer in the same way as a production mask pattern is imaged in the radiation-sensitive layer during the production process. Subsequently, the substrate is removed from the apparatus and is developed and etched so that an image of the test pattern in the form of a relief pattern in the substrate is obtained. This relief image is subsequently scanned by a scanning detection device, for example, a scanning electron microscope. The electron microscope converts the observed image into image data which are processed in an image processing device, using a special image processing program. Its results may be visualized in diagrams or graphs. It is alternatively possible to show visual images of the structures observed by the electron microscope on, for example, a monitor.

Figure 2:
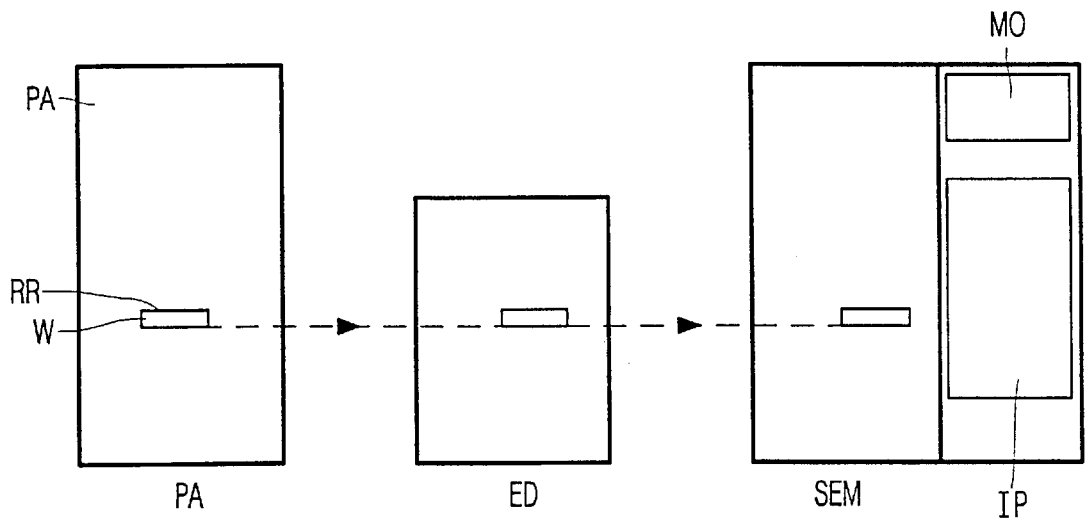
FIG. 2 is a block diagram of the system for performing the method.

This method is shown in a block diagram in FIG. 2. In this Figure, the projection apparatus is denoted by PA, the developing and etching apparatus is denoted by ED, the electron microscope is denoted by SEM, the image processing device is denoted by IP and the monitor is denoted by MO.

Figure 3A:
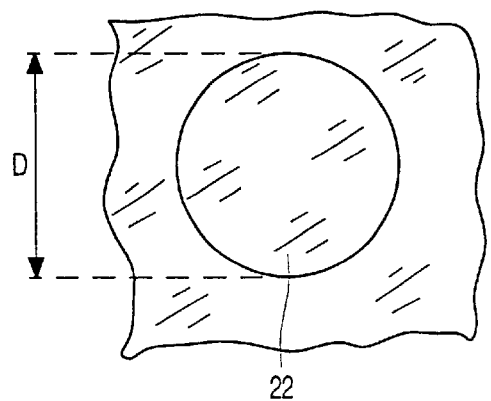
FIG. 3a is a bottom view of a test object with a single figure in the form of a recess.
Figure 3B:
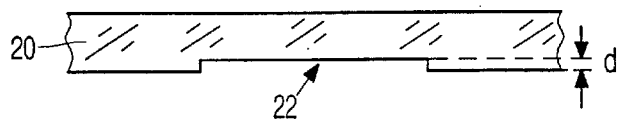
FIG. 3b is a cross-section of this test object.

According to the invention, use is made of a test object with a phase structure, a small part of which test object is shown in a bottom view in FIG. 3a and in a cross-section in FIG. 3b. This test object comprises at least one closed figure with a phase structure in the form of a circular recess 22 in a transparent test mask of, for example, quartz. This recess has a diameter D and a depth d. Instead of a recess, a figure of the test object may be alternatively constituted by a raised part having the same diameter and the same height difference with respect to the rest of the mask as said recess. Since the test mask is satisfactorily transparent to the projection beam with which the test figure is imaged on the photoresist layer, this figure forms a phase structure for this beam. This means that, after passage through the test mask, the part of the projection beam PB incident on the circular area 22 has obtained a different phase than the rest of the beam. The phase difference φ (in rad.) between the beam portions is defined by $$\varphi = \frac{(n_2 - n_1) \cdot d \cdot 2\pi}{\lambda}$$

which $n_2$ is the refractive index of the mask material, $n_1$ is the refractive index of the surrounding medium which is generally air, with n=1, and λ is the wavelength of the projection beam PB. The circle 22 is imaged by the projection lens system in a ring 24 shown in FIG. 4. It can be explained with reference to FIG. 5 how this ring is obtained.

Figure 4:
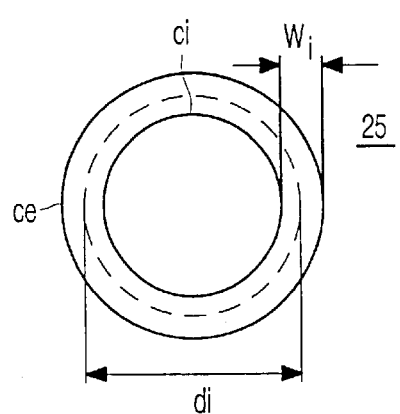
FIG. 4 shows the annular image formed of said recess.
Figure 5:
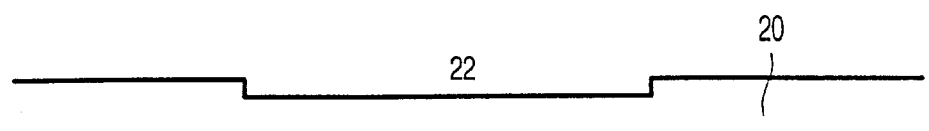
FIG. 5 shows the theory of the image formation.
Figure 5:
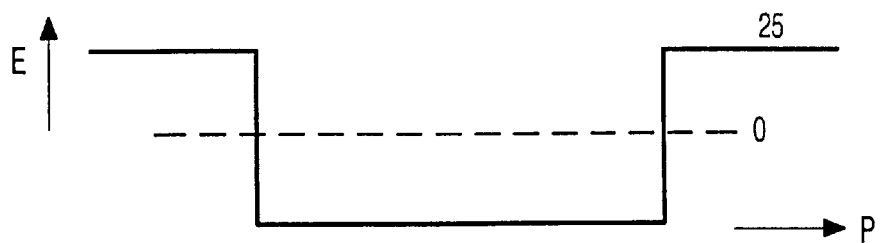
Figure 5:
Figure 5:
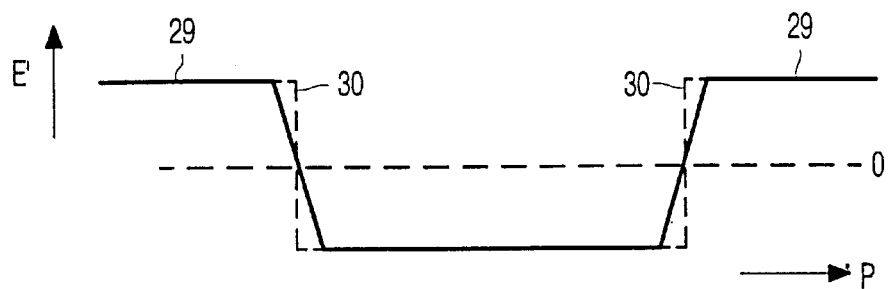
Figure 5:
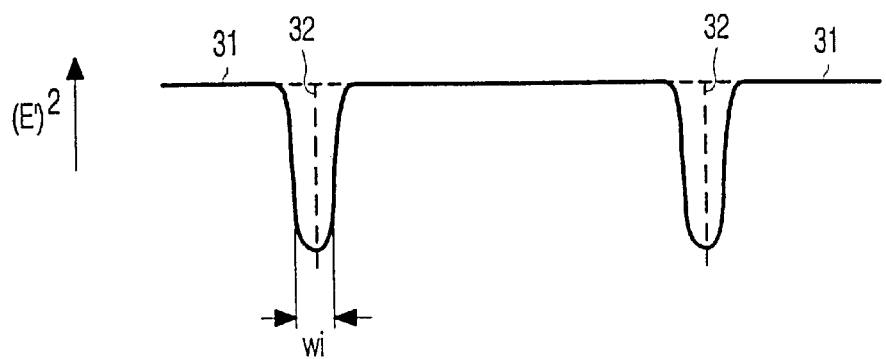

In this Figure, the reference numeral 22 denotes a circular area of the test mask on which the projection beam PB, a beam of electromagnetic radiation, is incident. After passage through the phase pattern 22, the size of the electric field vector E of this beam shows the variation as a function of the position p of graph 25. The perpendicular slopes in this graph are located at the position of the contour line of the phase pattern 22. After passage through the projection lens system PL shown diagrammatically by means of a single lens in FIG. 5, the size of the electric field vector E' shows the variation as a function of the position in graph 29. The perpendicular slopes have changed to oblique slopes. This is a result of the fact that the projection lens system is not an ideal system but has a point spread function, i.e. a point is not imaged as a point but is more or less spread across an Airy pattern during imaging. If the projection system were ideal, the electric field vector would have the variation as shown in the broken line graph 30. The size of the electric field vector represents the amplitude of the projection beam, so that the graph 29 shows the amplitude of the beam as a function of the position in the plane of the photoresist layer PR. Since the intensity I of the beam is equal to the square of the amplitude ($I=E'^2$), this intensity shows the variation as a function of the position in graph 31. Each edge in the graph 29 has changed over to two edges with opposite slopes, which means that the single contour line of the phase pattern is imaged in two contour lines, i.e. the circle is imaged in a ring 24 as shown in FIG. 4. The width wi of this ring is determined by the point spread function and its diameter di is determined by the resolution of the projection lens system. If the projection lens system did not have any point spread, the intensity of the projection beam in the photoresist layer would have the variation as shown by way of the broken line graph 32, and the phase pattern 22 would be imaged as a circle. In the method according to the invention, deliberate use is made of the point spread, though being small, of the projection lens system.

Upon use of this method in a given projection apparatus, the ring 24 had a width wi of 80 nm and a diameter di of 350 nm. The projection lens system had a magnification M=¼ so that the phase pattern in the mask had a diameter D=1.4 µm. The diameter di of 350 nm appeared to be an optimal value and corresponded to the resolution of the apparatus whose projection lens system had an NA of 0.63 and the projection beam had a wavelength of 248 nm. For other projection apparatus, di will have a different optimal value. Even if di has a value which is different from the optimal value, aberrations can still be measured.

For obtaining a good contrast in the image, the phase difference between the beam portion which has passed through the circular area 22 and the rest of the beam must be φ=π rad. This means that the depth d of the recess must be equal to the wavelength of the beam PB if the refractive index of the mask material is 1.5 and the surrounding medium is air having a refractive index of 1. For a practical embodiment, the optimal depth d is, for example, 233 nm. Usable results can still be obtained at depths different from the optimal depth.

If use is made of a test mask in which both the circular area 22 and its surroundings are reflecting, the optimal depth, or height, of the circular area is equal to a quarter of the wavelength.

If the projection lens system does not exhibit any aberrations, the inner circle ci and the outer circle ce of the ring in FIG. 4 are concentric and, during scanning through focus, this ring has a symmetrical behavior. Scanning through focus is understood to mean the movement of the image along the optical axis of the projection lens system in the +Z direction and the −Z direction with respect to the photoresist layer. This movement of the image with respect to the layer can be realized by changing the focus of the projection system or by moving this system and the photoresist layer with respect to each other in the Z direction.

When aberrations occur, said symmetry is disturbed. Each kind of aberration results in a characteristic deformation of the ring, as will be explained hereinafter.

To be able to satisfactorily observe the inner circle ci and the outer circle ce which are located close together, a scanning microscope may be used with a resolution which is larger than that (λ/NA) of the projection system. A scanning electron microscope, which may have a magnification of the order of 100,000 and can observe details of the order of 3.5 nm, is eminently suitable for this purpose, particularly if a large number of images must be detected. It is alternatively possible to use other scanning microscopes in the form of, for example, probe microscopes such as an optical probe microscope or an AFM (Atomic Force Microscope) or hybrid forms thereof, particularly if only a small number of images must be detected.

The image data obtained by scanning are subjected to a special image-processing method. This method may consist of, for example, two operations. The first operation comprises a determination of the contours of the ring in accordance with the steps of:

removing noise from the incoming image data;

determining the contours of the image, for example, by differentiation, or by determining in how far the intensity of each observed pixel is under a given threshold;

determining the point of gravity of the intensity distribution of the observed image;

measuring the distances between the pixels and this point of gravity, and plotting the measured distances in a histogram which then shows two peaks, the inner edge of the peak, where the smaller distances are clustered, representing the inner contour of the ring, and the outer edge of the peak, where the larger distances are clustered, representing the outer contour. The second operation consists of a Fourier analysis comprising the steps of:

decomposing radii of these contours each time extending at a different angle Θ to the X axis into sine and cosine functions of these angles, and filtering the contours, and visualizing the intensities of the Fourier components thus obtained in graphs. Analysis methods which are different from this Fourier analysis may be used instead. It is essential that the radii of the contours are measured as a function of the angle Θ. The advantage of the Fourier analysis is that it has sine functions and cosine functions as basic functions. Determining the radii of the contours as a function of the angle Θ can be most easily done by way of the sine function and the cosine function. The aberrations can thereby be detected in a direct manner. More operations must be performed in other analysis methods.

Figure 6:
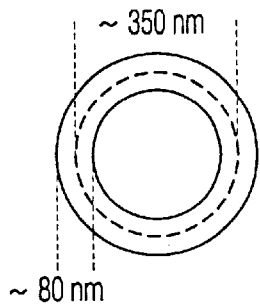
FIG. 6 shows an annular image without aberrations.

If the projection lens system does not have any aberrations, the inner contour and the outer contour of the annular image are satisfactorily circular, and the circles are satisfactorily concentric throughout their circumference, as is shown in FIG. 6. Moreover, the rotational symmetry is then maintained upon scanning through focus.

FIG. 6 shows a SEM image obtained by means of an aberration-free lens system and with the following imaging conditions: λ=248 nm, NA=0.63, σ=0.3, the thickness of the photoresist layer=280 nm. σ, also referred to as the degree of coherence, indicates the extent to which the imaging beam fills the pupil of the lens system. A σ of 0.3 means that the imaging beam has a cross-section which is equal to 0.3 of the pupil cross-section.

Figure 7:
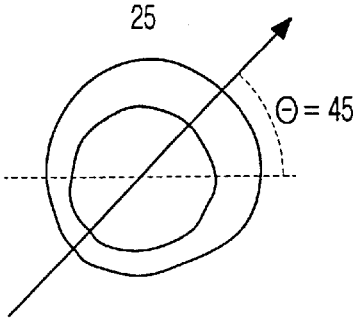
FIG. 7 shows an annular image with coma.

The major aberrations of the projection lens system are coma, astigmatism, the three-point, or three-leaf, aberration, and spherical aberration. If the projection lens system has coma, the image formed therewith and observed by the SEM has the shape as shown in FIG. 7. The coma in this example is obtained artificially by deliberately changing the wavelength of the imaging beam to some extent. The other imaging conditions are equal to those mentioned with reference to FIG. 6. The image formed in FIG. 7 is an image formed in the top right angle of the image plane if this image plane is considered to coincide with the plane of the drawing, likewise as in FIG. 15 to be described hereinafter. This image has a coma of 45°. The inner contour and the outer contour are circles which are no longer centered with respect to each other but are offset with respect to each other in the direction of the coma, hence in the direction of 45°.

Figure 8:
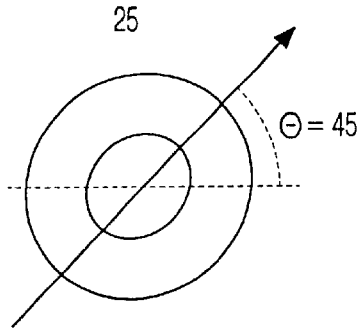
FIG. 8 shows an annular image with astigmatism.

FIG. 8 shows an image formed by a projection lens system having astigmatism. The other imaging conditions are again equal to those mentioned with reference to FIG. 6. The contour lines of the astigmatic image are elliptical, while the distance between these lines, i.e. the width wi of the ring, is constant throughout the circumference. The major axis of the ellipse is parallel to the direction of the astigmatism. Since the image in FIG. 8 is again an image formed in the top right angle of the image plane, the major axis of the ellipse extends under 45°. The astigmatism of the projection lens system has been obtained artificially by deliberately displacing a movable lens element of this system to some extent with respect to its nominal position.

Generally, the points of the contour lines may be represented by the series:

$$\sum_{m=0}^{\tilde{}} R_m(r) \cdot \cos(m\theta) + R'_m(r)\sin(m\theta)$$

in which $R_m(r)$ is the nominal distance of the relevant point to the center of the image, r indicates whether the relevant point is associated with either the inner contour or the outer contour, $\cos(m\Theta)$ and $\sin(m\Theta)$ is the angle dependence of the real distance between the relevant point and the center and m is determined by the type of aberration.

For spherical aberration, m=0. This aberration is not dependent on the angle $\Theta$, and an image formed with an imaging system having spherical aberration is rotationally symmetrical around the optical axis of the imaging system, i.e. around the Z axis in FIG. 1. The change of the image due to spherical aberration is dependent on the position along the Z axis.

For the comatic aberration, m=1. An image formed with an imaging system having this aberration has a single axis of symmetry, in the example of FIG. 7 the axis under 45° along which the circles are displaced with respect to each other.

For the astigmatic aberration, m=2. When this aberration occurs, the formed, elliptic image has two axes of symmetry, namely the major axis and the minor axis of the ellipse. In the example of FIG. 8, these are the axes shown under 45° and an axis perpendicular thereto.

Figure 9:
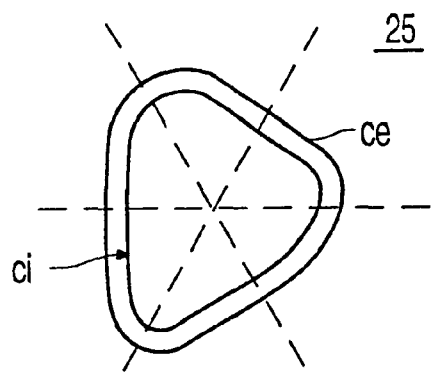
FIG. 9 shows an annular image with three-point aberration.

For the three-leaf, or three-point, aberration, m=3. When this aberration occurs, the image shows three axes of a symmetry. The image of FIG. 7 does not only have comatic aberration but also a small three-point aberration. An image having a larger three-point aberration is shown in FIG. 9.

The description has hitherto been based on a single test pattern. However, a test mask may have a large number of test patterns, for example 121, so that the aberrations can be measured at an equally large number of positions in the image field of the projection lens system. In practice, not all of these test patterns, but a smaller number will be used, for example 21, in which these test patterns are located at such positions that most information about aberrations can be obtained therefrom. Since the test patterns are so small, they may also be provided in a production mask, i.e. a mask with an IC pattern, without this being at the expense of the details of the relevant IC pattern. Then it is not necessary to manufacture separate test masks and to exchange masks for measuring aberrations.

For performing the novel method by means of a lithographic projection apparatus, the projection beam preferably has a small beam cross-section at the location of the mask so that a maximal quantity of projection radiation is concentrated on the test pattern and a clear image is obtained. Novel generations of lithographic projection apparatuses have special illumination systems which provide, inter alia, the possibility of adapting the cross-section of the projection beam, with the total radiation energy of the beam being maintained. Such an illumination system is described, for example, in the article: "Photolithography using the AERIAL illuminator in a variable NA wafer stepper" SPIE Vol. 2726, Optical Microlithography IX, Mar. 13–15, 1996, pp. 54–70. The ratio between the cross-section of the projection beam and the pupil cross-section is denoted by σ, or degree of coherence. For projecting the mask pattern, σ values of between 1 and 0.3 are currently used. In accordance with the invention, such a lithographic apparatus can be made eminently suitable for performing the novel method of measuring aberrations if the means for limiting the beam cross-section are implemented in such a way that the a values can be set at the order of 0.2 or less. These means can be obtained by adapting the beam-limiting means already present in the lithographic apparatus in such a way that the cross-section of the projection beam can be made considerably smaller than the beam cross-section which is used for projecting the mask pattern on the substrate. This further reduction of the beam cross-section can then be realized while maintaining the total energy in the beam. For the aberration measurements, it is alternatively possible to arrange an extra diaphragm in the radiation path between the radiation source and the mask holder, the aperture of said diaphragm being adjustable in such a way that a values of between 1 and, for example, 0.1 can be adjusted.

The use of the invention in a stepping lithographic apparatus has been described hereinbefore, i.e. in an apparatus in which the whole mask pattern is illuminated and imaged in a first IC area, and subsequently the mask pattern and the substrate are moved with respect to each other until a subsequent IC area is positioned under the mask pattern and the projection system, hence one step is made, whereafter this IC area is illuminated with the mask pattern, another step is made again, and so forth until the mask pattern has been imaged on all IC areas of the substrate. To alleviate the requirements of a large NA and a large image field imposed on the projection lens system and/or to increase the resolution and the image field of the apparatus, a step-and-scanning apparatus is preferably used. In this apparatus, a mask pattern is not imaged as a whole in one step, but the mask pattern is illuminated by a beam having a narrow, rectangular or circularly segment-shaped beam cross-section, and the mask pattern and the substrate are moved synchronously with respect to the system, while taking the magnification of the projection system into account, so that all sub-areas of the mask pattern are consecutively imaged on corresponding sub-areas of the substrate. Since the cross-section of the projection beam in one direction, for example, the X direction, is already small in such an apparatus, only the beam cross-section in the other direction, for example, the Y direction should be decreased so as to obtain an optimal illumination for the novel method.

FIGS. 10–25 show a number of examples of measuring results obtained by means of the method according to the invention.

Figure 11:
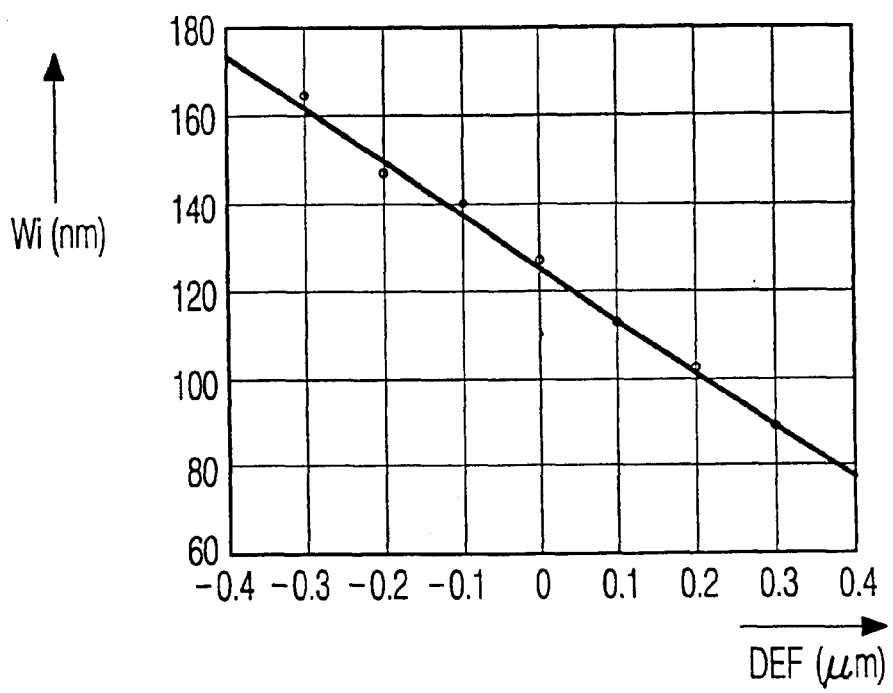
FIG. 11 shows this variation in a graphic form.
Figure 10:
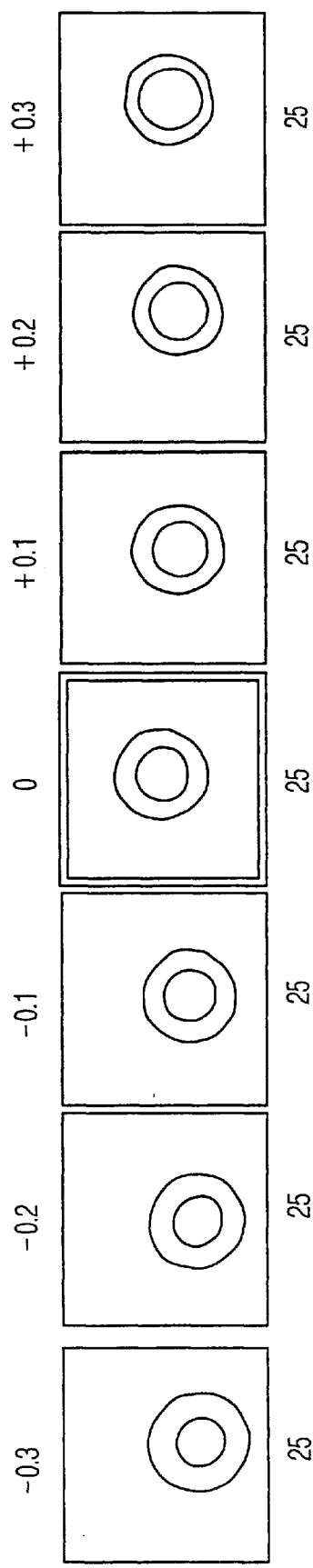
FIG. 10 shows the variation of the ring width of an annular image with spherical aberrations for different focus settings.

FIGS. 10–14 relate to spherical aberration. As already noted, the annular image 25 remains rotationally symmetrical when this aberration occurs, but the width wi of the ring is dependent on the extent of defocusing. In the experiment performed, a spherical aberration was introduced artificially by readjusting the height, the Z position, of the mask table by 40 $\mu$m with respect to the nominal height. FIG. 10 shows the annular images obtained by readjusting the focus of the projection lens system from −0.3 $\mu$m to +0.3 $\mu$m with respect to the nominal focus. FIG. 11 shows the then occurring change of the width of the ring in a graphic form. In this Figure, the defocusing DEF is plotted in $\mu$m on the horizontal axis and the ring width wi is plotted on the vertical axis. As is shown in FIG. 11, the ring width at nominal focus setting has increased from the above-mentioned 80 nm to approximately 130 nm, while a ring width of 80 nm is obtained at a defocusing of 0.4 $\mu$m.

Figure 12:
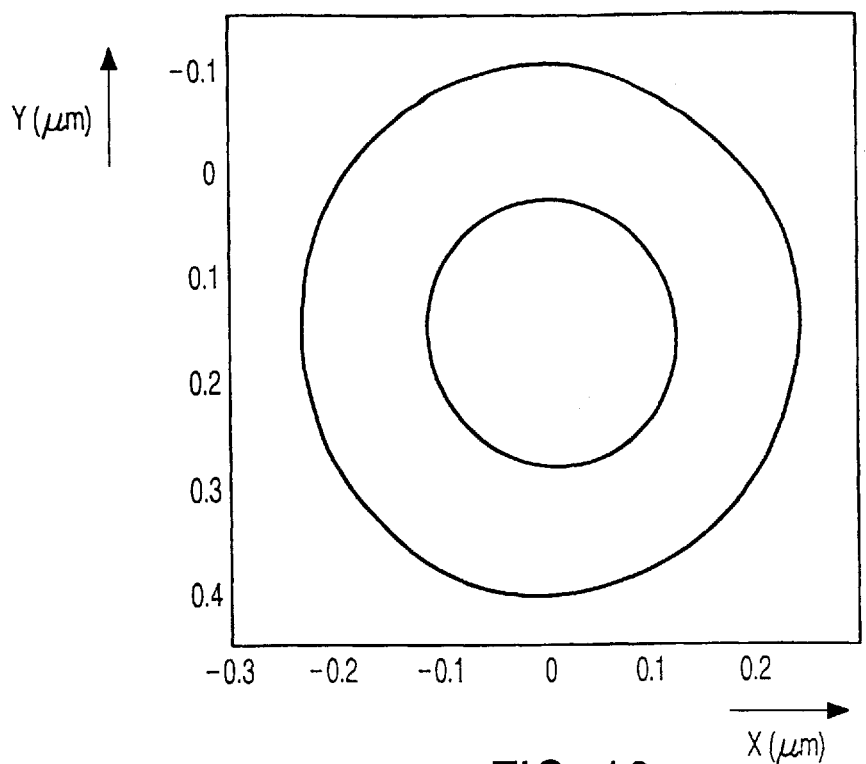
FIG. 12 shows an annular image picked up under the best focus condition.
Figure 13:
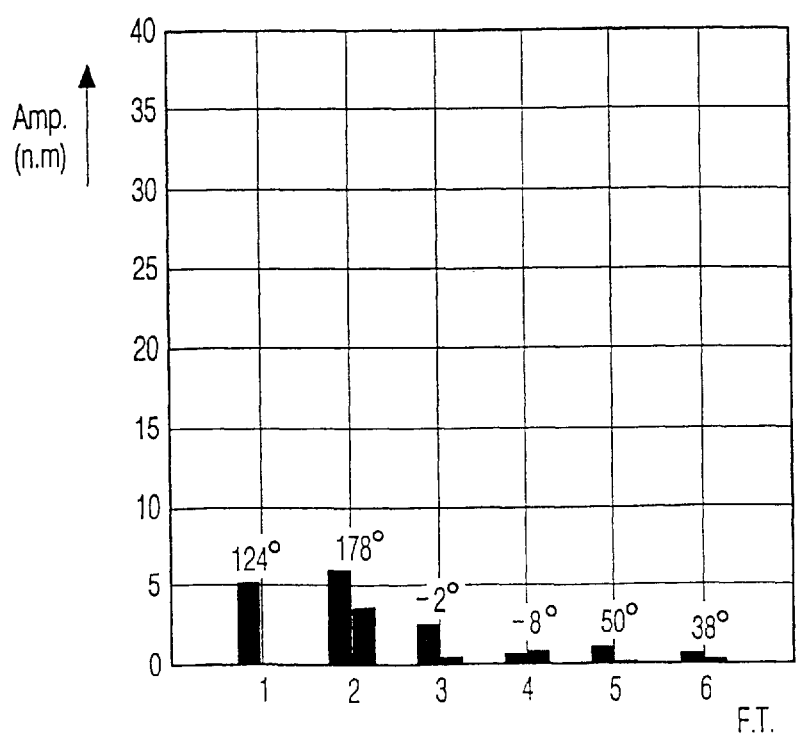
FIG. 13 shows the different Fourier terms associated with this image.

FIG. 12 shows the shape and the location in the XY plane of an annular image in the best focus position. The origin of the XY system of co-ordinates is located on the optical axis of the projection system. FIG. 13 shows the Fourier analysis data of this image. The Fourier terms FT expressed in frequencies of the angle $\Theta$ are plotted on the horizontal axis. The Fourier term at the position 1 represents coma which is proportional to $\cos\Theta$, that at position 2 represents astigmatism which is proportional to $\cos 2\Theta$, that at position 3 represents three-point aberration which is proportional to $\cos 3\Theta$, and that at positions 4, 5 and 6 represents other aberrations which are negligibly small for the example given. The amplitudes of the deviations of the circle are plotted in mn on the vertical axis. For the example shown in FIG. 12, there is some coma at an angle $\Theta=124°$, some astigmatism at $\Theta=178°$ and some three-point aberration at $\Theta=-2°$.

Figure 14:
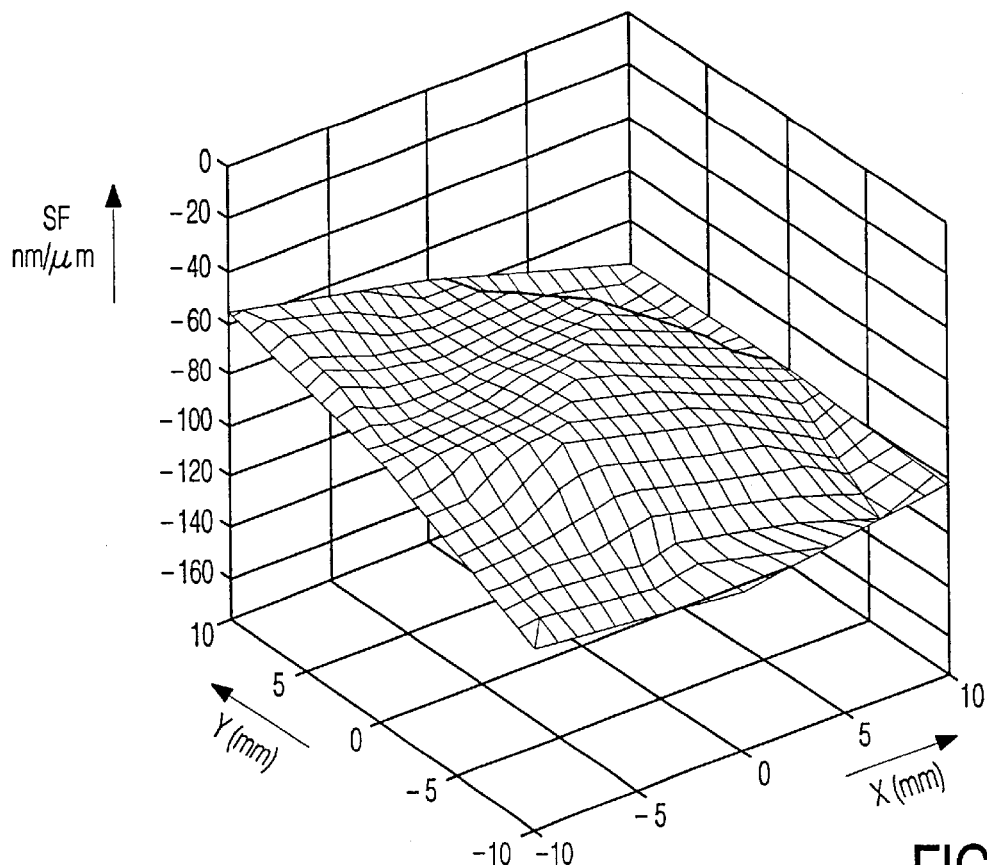
FIG. 14 shows the variation of a spherical aberration across the image field of the projection system.

The three-dimensional FIG. 14 shows an example of the variation throughout the image field, in this example 20×20 mm large, of a spherical aberration. The X and Y positions in the image field are plotted on the axes of the base plane and the spherical aberration is plotted on the vertical axis. This aberration is expressed in the number of nm change of the ring width wi per $\mu$m offset of the focus. The average spherical aberration across the image field is equal to −85 nm/$\mu$m in this example.

Figure 15:
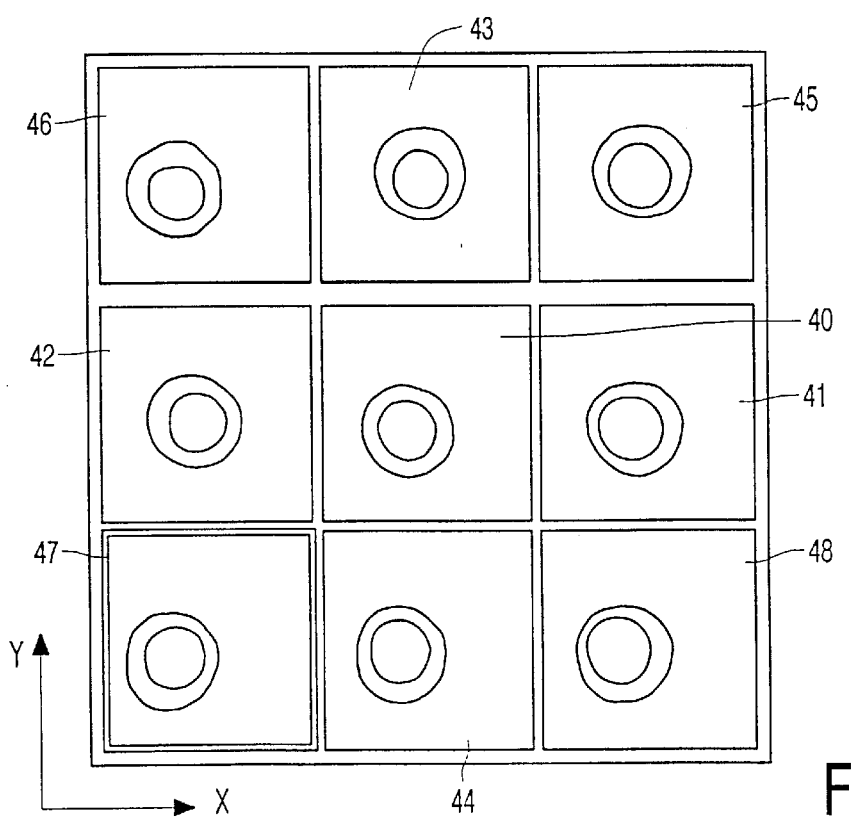
FIG. 15 shows annular images with coma formed at different positions in the image field.

FIGS. 15–18 relate to a comatic aberration which has been introduced artificially by imaging the test object with radiation whose wavelength is 40 pm larger than the nominal wavelength, i.e. the wavelength for which the projection system has been designed. FIG. 15 shows the annular images 40–48 which are then formed at different positions in the image field. As already noted, the inner contour and the outer contour are offset with respect to each other when coma occurs, so that these contours are no longer centered with respect to each other. The coma is relatively small in the center of the image field, as is shown by the central image 40. Upon a displacement from the center, the coma increases, while the direction of the coma coincides with the direction of the displacement. The coma directions are approximately +45°, +135°, −135° and −45° for the images 45, 46, 47 and 48, respectively.

Figure 16:
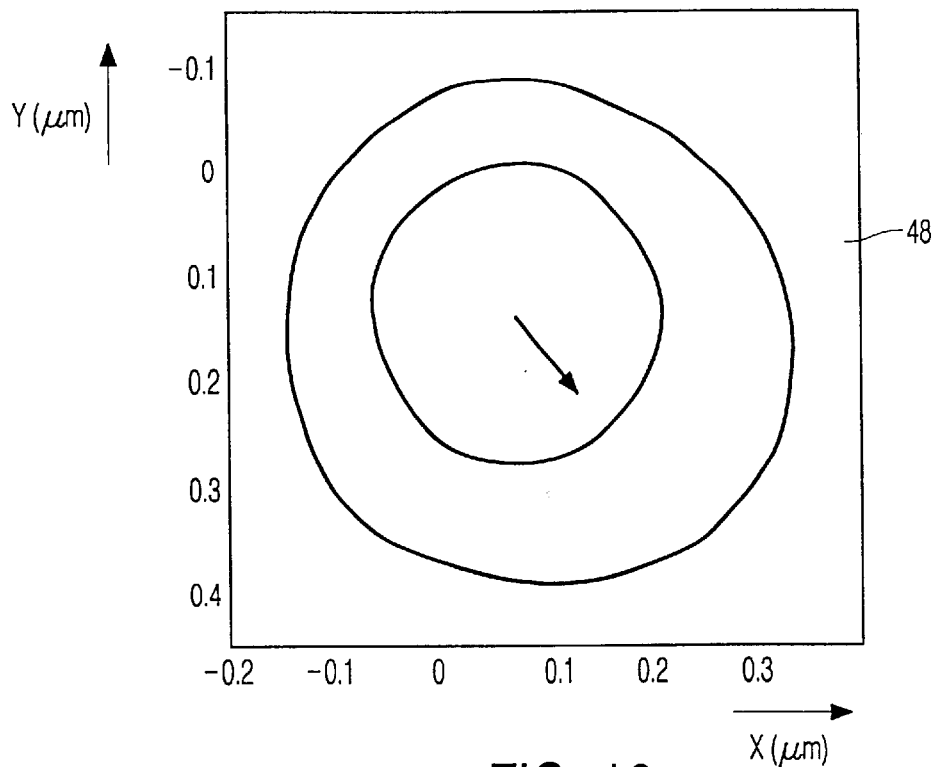
FIG. 16 shows such an image on a larger scale, formed at an angle of the image field.

The coma is not only dependent on the position in the image field but also on the extent to which the imaging beam is focused on the photoresist layer. If at a fixed position in the image field scanning through focus takes place, then the coma has a parabolic variation as a function of the defocusing, with the smallest coma occurring if the focusing is optimal. FIG. 16 shows a magnification of the image 48 for the best focus condition.

Figure 17:
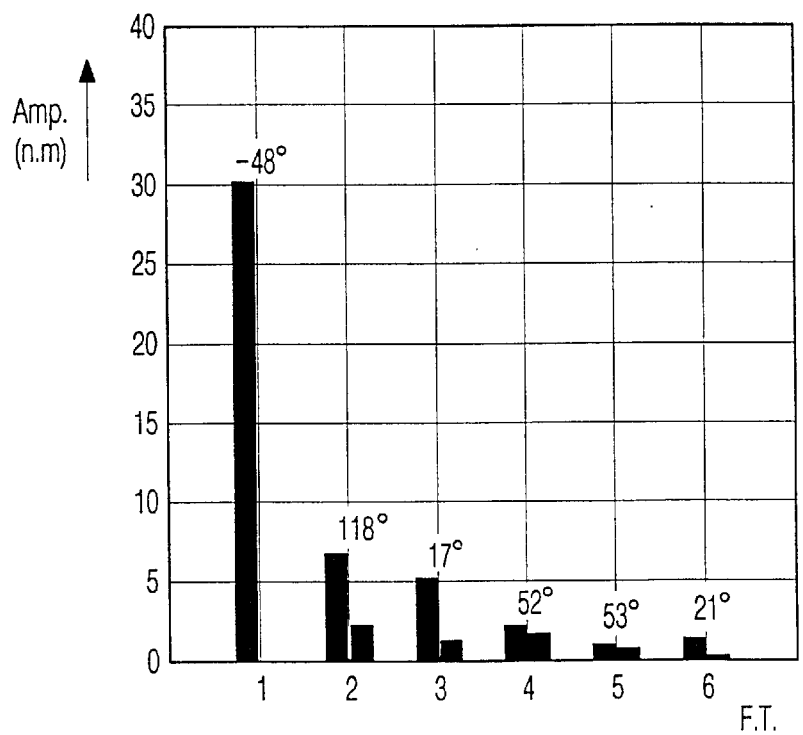
FIG. 17 shows the different Fourier terms associated with this image.

FIG. 17 shows the Fourier graph associated with the image of FIG. 16. It is apparent from FIG. 17 that the direction of the coma is −48° and its amplitude is 30 nm. The projection system with which this image is made also has an astigmatism of approximately 7 nm at an angle $\Theta$ of 118° and a three-point aberration of approximately 5 nm at an angle $\Theta$ of 17°.

Figure 18:
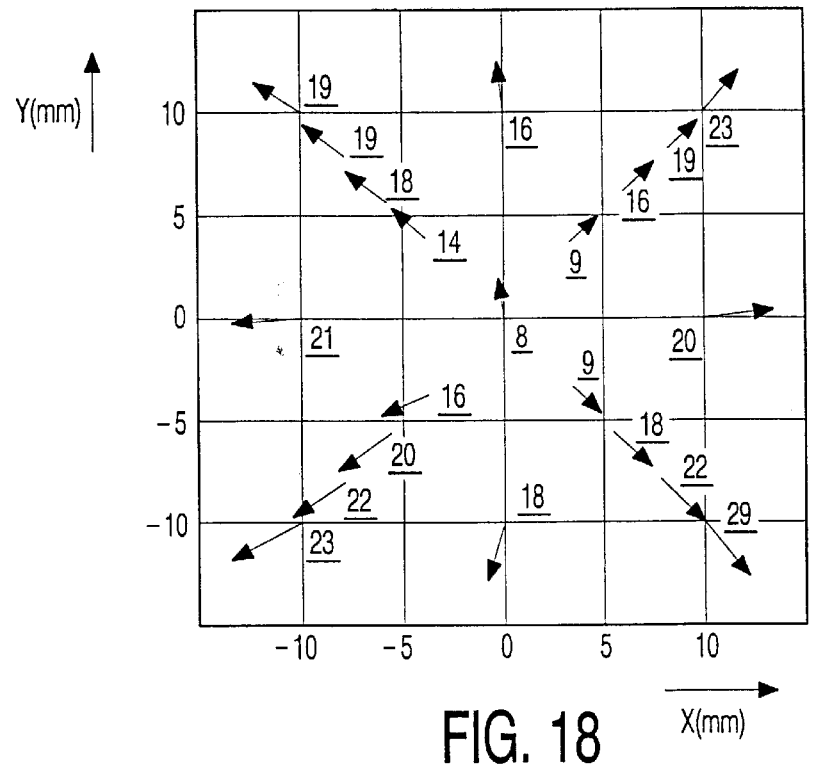
FIG. 18 shows a chart of the coma measured at 21 positions in the image field.

FIG. 18 shows a coma chart obtained by imaging the test pattern at 21 different positions in the image field, the XY plane. The direction of the coma at a measured position is indicated by the direction of the arrow shown at that position and the size of the coma is indicated by the underlined number near this arrow. Each number in FIG. 18 is the average of the coma numbers associated with the relevant field position and obtained by scanning through focus. The average coma throughout the image field of the example shown in FIG. 18 is 18 nm.

FIGS. 19–22 relate to an astigmatic aberration. Instead of a single focal point, an imaging system having astigmatism has a first and a second, astigmatic, focal line, which focal lines are perpendicular to each other. The length of these focal lines is dependent on the position along the optical axis of the imaging system. In the position where the beam has its narrowest constriction, the focal lines are equally long and the image is circular. At positions located before the position of narrowest constriction, the first focal line is longer than the second, and the image is elliptical, with the major axis of the ellipse extending in the direction of the first focal line. At positions located behind the position of the narrowest constriction, the second focal line is longer than the first, and the image is elliptical, with the major axis of the ellipse extending in the direction of the second focal line. To determine the astigmatic aberration of a lens system, it is necessary to scan through focus. In accordance with the novel method, the astigmatism is detected by determining the change of the second harmonic (2$\Theta$) as a function of the defocusing. This astigmatism is expressed in nm per $\mu$m defocusing.

Figure 19:
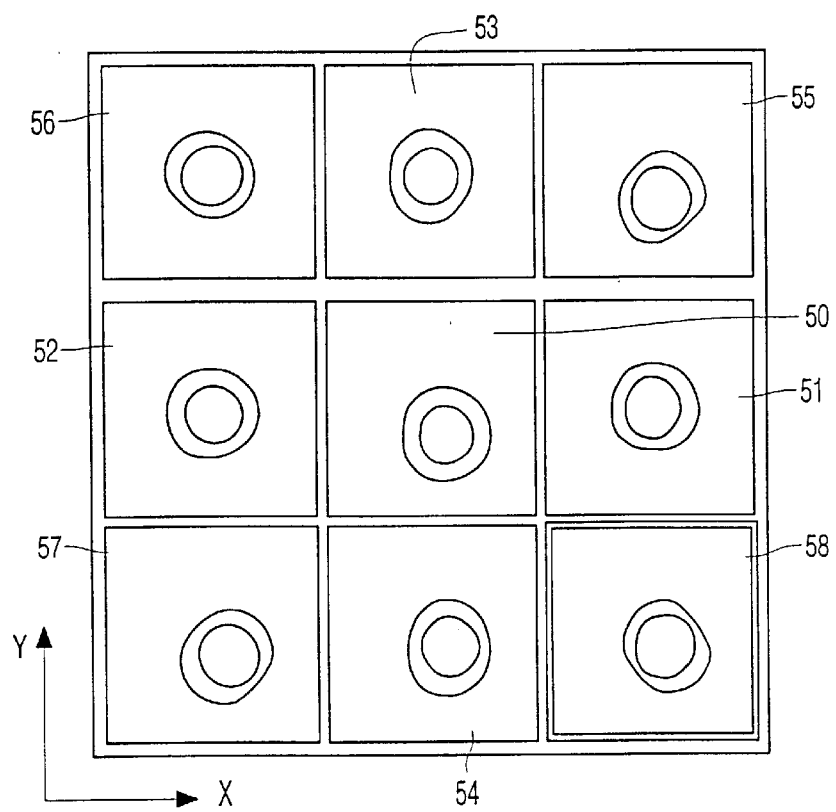
FIG. 19 shows annular images with astigmatism formed at different positions in the image field.

FIG. 19 shows images 50–58 which are formed at nine different positions in the image field by a projection system having astigmatism. This astigmatism has been introduced artificially by displacing a movable lens element of the projection system by 40 $\mu$m with respect to its nominal position. In the center of the image field, the astigmatism is relatively small as is shown by the central image 50. Upon a displacement from the center, the astigmatism increases, with the direction of the astigmatism coinciding with the direction of the displacement. The directions of astigmatism are approximately +45°, +135°, −135° and −45° for the images 55, 56, 57 and 58, respectively.

Figure 20:
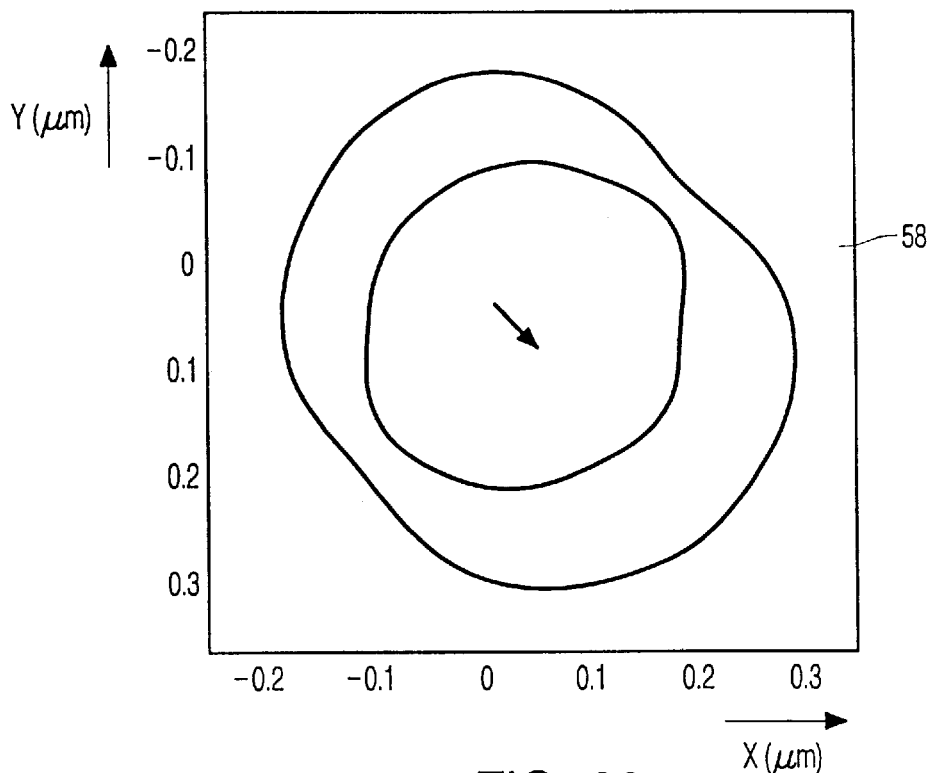
FIG. 20 shows such an image on a larger scale, formed at an angle of the image field.
Figure 21:
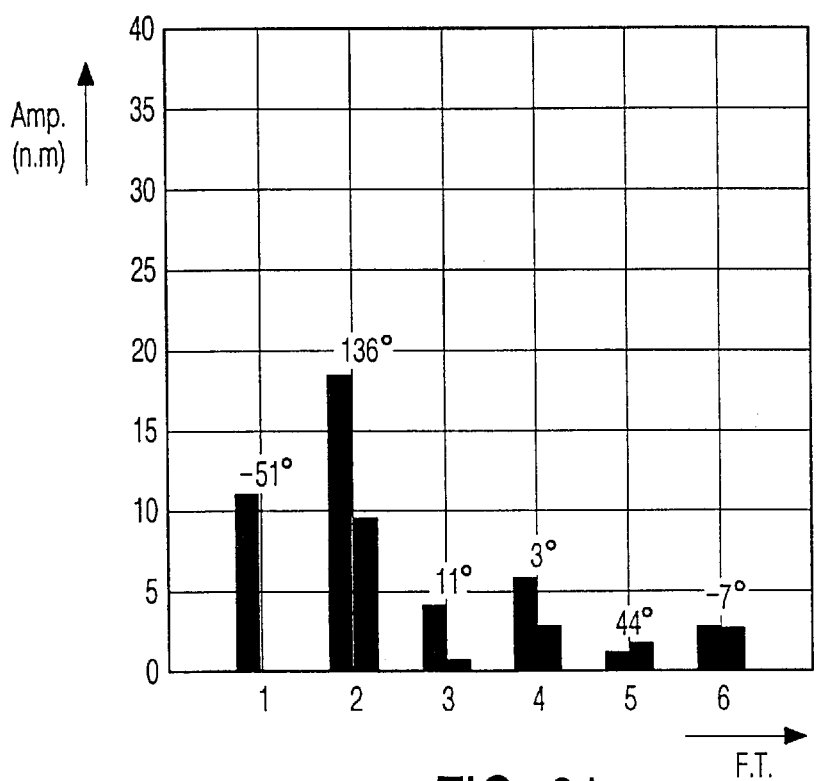
FIG. 21 shows the different Fourier terms associated with this image.

FIG. 20 shows a magnification of the image 58 and FIG. 21 shows the associated Fourier graph. It is apparent from the latter Figure that the direction of the astigmatism is 136° and its size is approximately 18 nm/μm. The projection system with which this image is formed also has a coma of 11 nm at an angle Θ of 51°, a three-point aberration of 4 nm at an angle Θ of 11° and a four-point aberration of 6 nm, proportional to cos4Θ, at an angle Θ of 3°. An image formed by a projection lens system with four-point aberration has four axes of symmetry.

Figure 22:
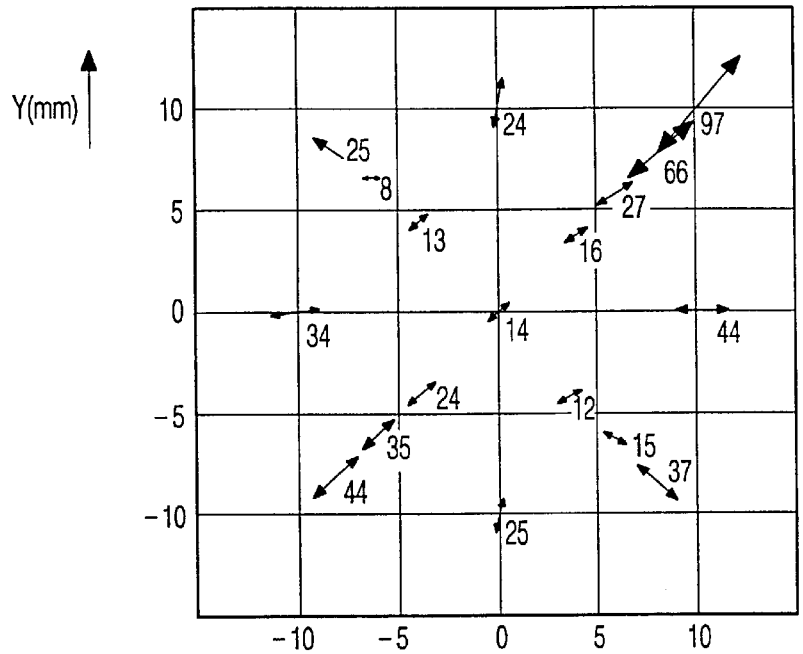
FIG. 22 shows a chart of the astigmatism measured at 21 positions in the image field.

FIG. 22 shows an astigmatism chart obtained by forming images of the test pattern at 21 different positions of the image field, the XY plane. The direction of astigmatism at a measured position is indicated by the direction of the arrow at that position, and the amount of the astigmatism is indicated by the underlined number at that position. Each number in FIG. 22 is the average of the astigmatic numbers associated with the relevant position and obtained by scanning through focus. For the given example, the average astigmatism throughout the image field, i.e. the average of the numbers of FIG. 22 is 31.1 nm.

Figure 23:
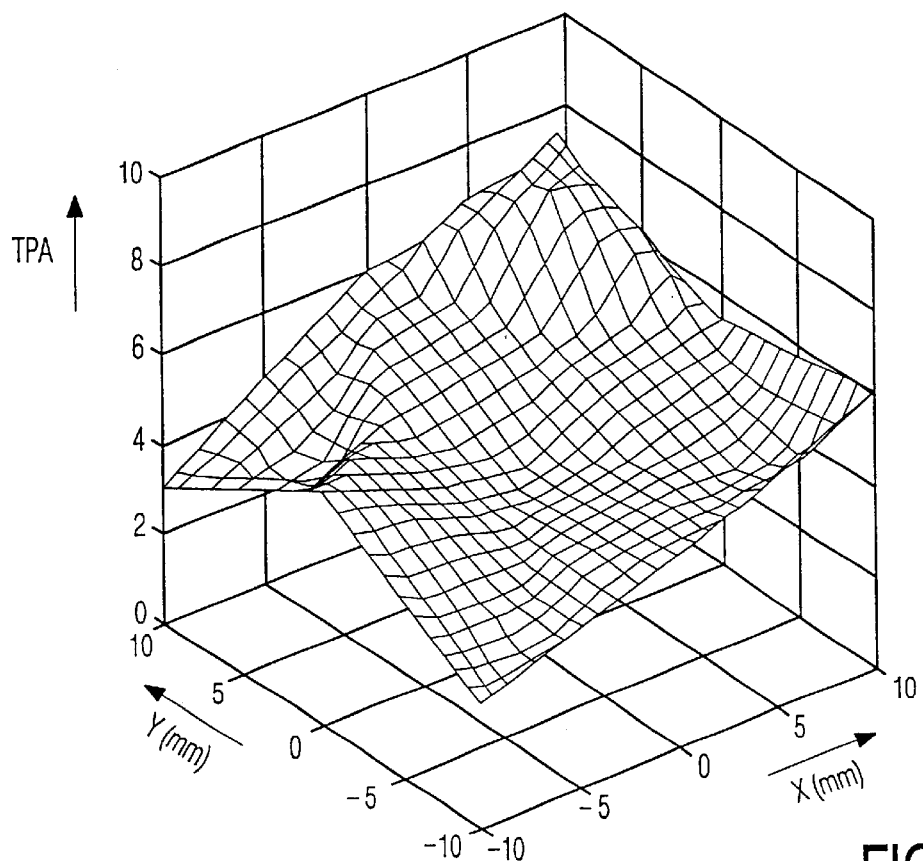
FIG. 23 shows the variation of a three-point aberration across the image field of the projection system.

An example of measured three-point aberrations is shown in the three-dimensional FIG. 23. The X and Y positions in the image field are plotted along the axes of the base plane in this Figure and the size of the aberration is plotted in nm on the vertical axis. Also this aberration is maximal at the angles of the image field. The aberration is relatively small; the average value of this aberration in this example is 4.7 nm.

Figure 24:
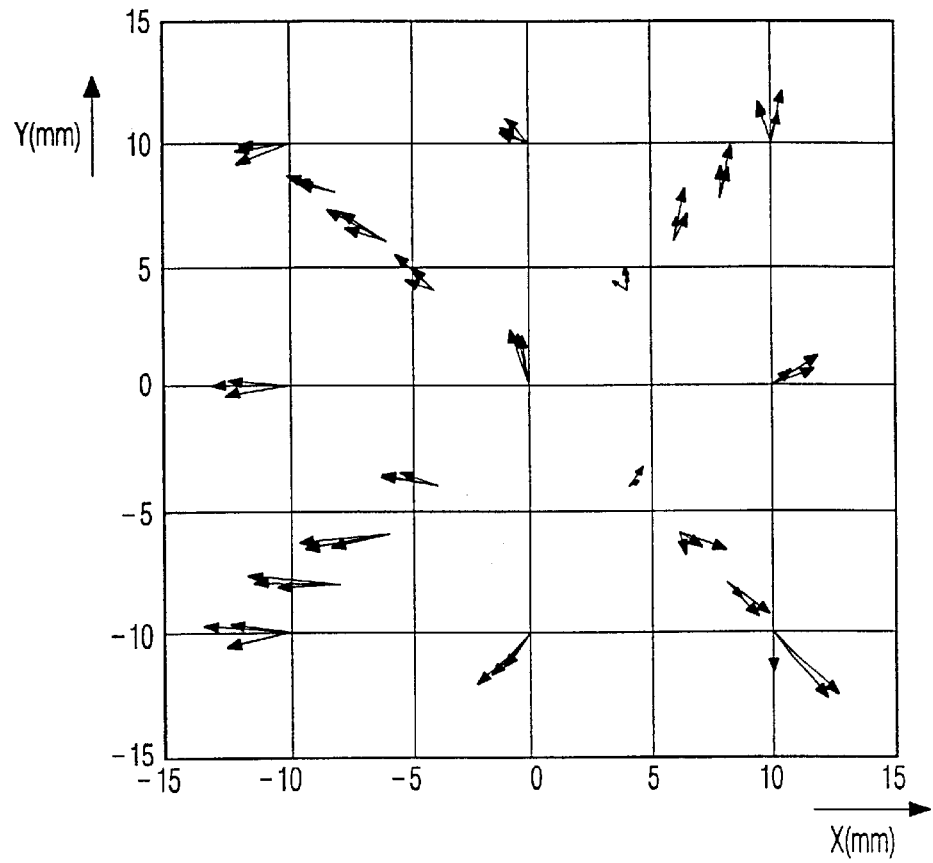
FIG. 24 shows the influence of spherical aberration and astigmatism on the measured coma across the image field.
Figure 25:
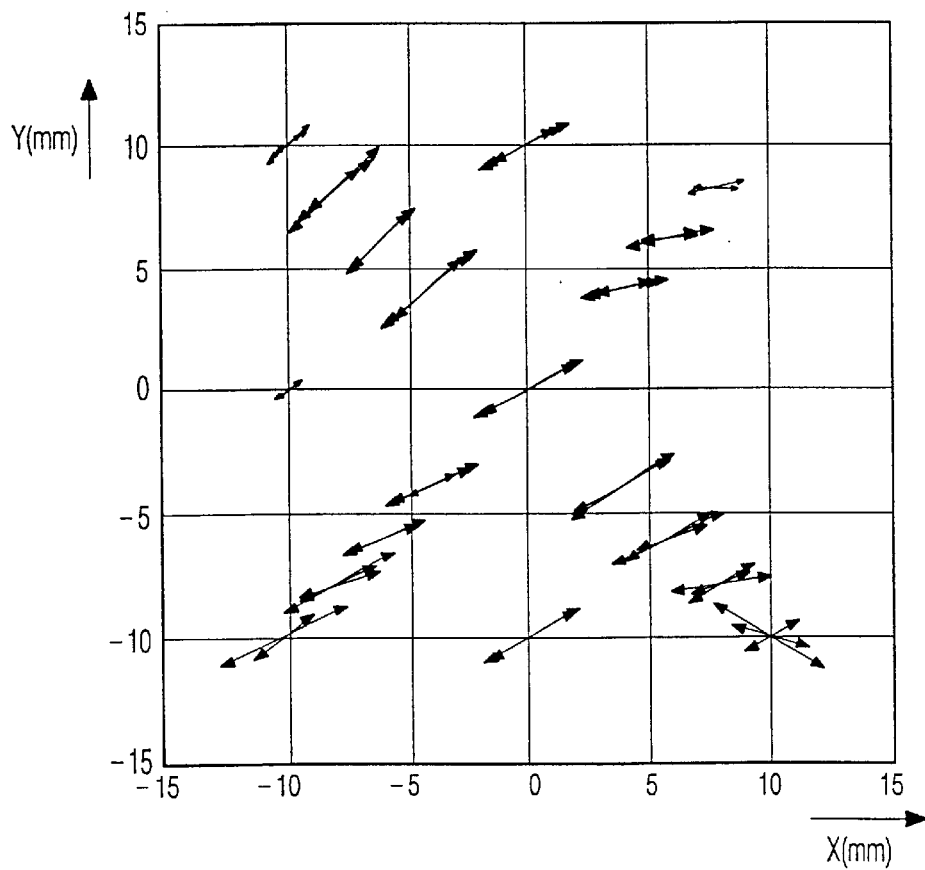
FIG. 25 shows the influence of spherical aberration and coma on the measured astigmatism across the image field.

FIGS. 24 and 25 illustrate that simultaneously occurring aberrations of different types can be measured separately by means of the method according to the invention. FIG. 24 shows a coma chart which is similar to that of FIG. 18. Not only first arrows representing the pure coma are shown at the 21 different positions in the image field, but also second arrows representing the measured coma in the presence of spherical aberration, and third arrows representing the measured coma in the presence of astigmatism. It is apparent from this Figure that the measured coma size and direction generally changes to only a small extent when said two other aberrations occur.

FIG. 25 shows an astigmatism chart which is similar to that of FIG. 22. Not only first arrows representing the pure astigmatism are shown at the 21 different positions in the image field, but also second arrows representing the astigmatism in the presence of spherical aberration, and third arrows representing the astigmatism in the presence of coma. It is apparent from this Figure that the measured size and direction of the astigmatism generally changes to only a small extent when spherical aberration and coma occur simultaneously.

Figure 26:
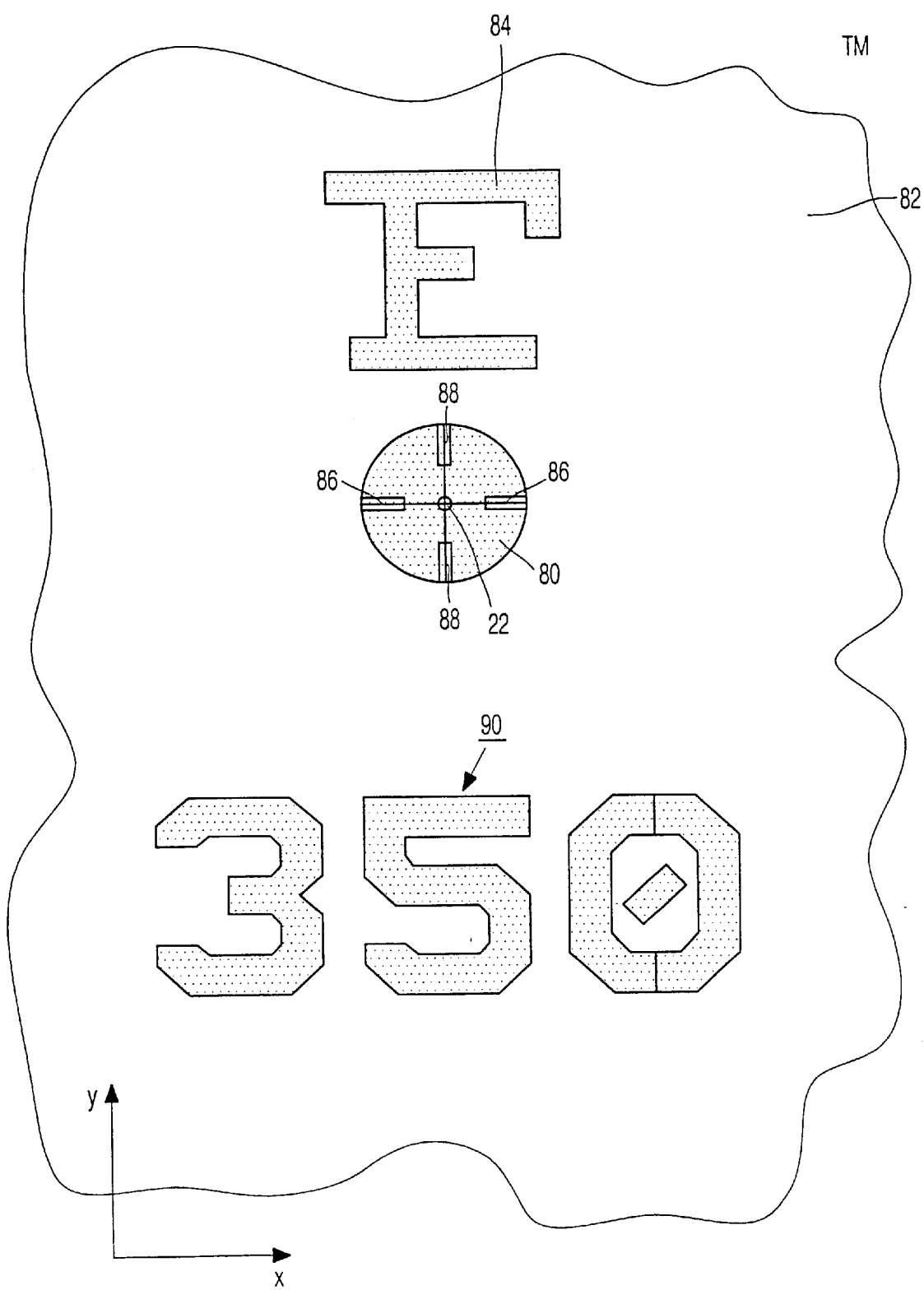
FIG. 26 shows a small part of an embodiment of a test mask with a detection mark and a further mark.

The circular phase structure(s) cover(s) only a very small part of the mask surface area. If an entirely transparent test mask is used, the radiation passed by the mask outside the area of the phase structure may have the effect of interference radiation and reduce the quality of the image of the phase structure. To prevent this, a test mask is preferably used in which only the circular phase structure, further referred to as the figure, and a relatively small area around it, hereinafter referred to as figure, area, are transparent, while the rest of the mask, hereinafter referred to as outer area, has been made opaque, for example by coating it with chromium. FIG. 26 shows a part of a test mask TM having a circular phase structure, or area, denoted by the reference numeral 22 again. The transparent figure area around the circle 22 is denoted by the reference numeral 80. This area consists of transparent mask material (20 in FIG. 3b). Outside the figure area, the mask is coated with a chromium layer 82.

To achieve that a scanning electron microscope, or another scanning detection device, can easily find the small image of the FIG. 22, a recognition mark 84 is provided in the test mask and in the outer area of each phase pattern, as is shown in FIG. 26. This mark, which is formed by an F-shaped opening in the chromium layer in the example shown, may be an arbitrary mark, provided that it has details extending in the X direction as well as details extending in the Y direction. As is shown by FIG. 26, the strips extending in the X direction and the strips extending in the Y direction of the recognition mark are considerably larger than the FIG. 22 so that this mark is more easily observable and is suitable for navigation of the detection device. As soon as this mark has been observed, the detection device can be directed within the area on the substrate which corresponds to the outer area 82 of the test mask to the image of the figure area 80 and start searching the image of the FIG. 22 located within this area. Opaque, chromium-coated strips 86 in the X direction and strips 88 in the Y direction may be present within the figure area 80 so as to simplify the navigation of the detection device within the area on the substrate corresponding to the figure area 80.

Further information may be provided, as is denoted by the reference numeral 90, in each outer area 82 of the test mask. In this example, the information relates to the diameter of the imaged ring (d in FIG. 4) chosen for the relevant area 82. This information may also be, for example, position information and indicate the X and Y co-ordinates of the relevant figure area 80 on the test mask. Further information which may be useful for performing the method may also be provided in the recognition mark 84.

Since the marks 84 and 90 have relatively large details, these details will always be imaged in such a way that they are still reasonably recognizable for the scanning detection device, even if the imaging circumstances are not ideal, for example, if the quantity of illumination used is not optimal. If, for example, a too small quantity of illumination were used, the quality of the image of the phase FIG. 22 would be reduced to such an extent that the method can no longer be used satisfactorily. By observing the mark 84 and/or 90, the cause of the poor image quality can be ascertained, so that the circumstances can be adapted thereto in such a way that a usable image of the phase pattern is as yet obtained and the method can still be used.

It has hitherto been assumed that the phase FIG. 22 is formed by an area which is located higher or lower than the rest of the plate or test mask 20. The phase figure may, however, also consist of an area having a different refractive index than the rest of the plate. Such an area introduces also a phase jump in a beam passing through the plate. If a reflecting production mask is used in the lithographic apparatus, and if the novel method is performed with a reflecting test mask, the FIG. 22 and the figure area 80 will have to be transparent to this test mask so as to cause this FIG. 22 to be active as a phase structure with a deviating refractive index. To reflect the imaging beam which has passed through the test mask at the location of the FIG. 22 and the figure area 80, the test mask may be provided with reflecting means at the relevant locations.

The text hereinbefore only describes measurements on a projection lens system for a lithographic apparatus. However, the projection system for such an apparatus may also be a mirror projection system. Such an projection system must be used if EUV radiation is used as projection radiation. EUV, or extreme ultraviolet, radiation is understood to mean radiation at a wavelength in the range of several nm to several tens of nm. This radiation is also referred to as soft X-ray radiation. The use of EUV radiation provides the great advantage that extremely small details, of the order of 0.1

μm or less, can be imaged satisfactorily. In other words, an imaging system in which EUV radiation is used has a very high resolution without the NA of the system having to be extremely large so that also the depth of focus of the system still has a reasonably large value. Since no suitable material which is sufficiently transparent and suitable for making lenses is available for EUV radiation, a mirror projection system instead of a conventional projection lens system must be used for imaging a mask pattern on the substrate. Different embodiments of such mirror projection systems are known, which may comprise three to six mirrors. As the number of mirrors increases, the quality of the image is enhanced, but due to reflection losses, this is at the expense of the quantity of radiation on the substrate. A mirror projection system with six mirrors is described in, for example EP-A 0 779 528.

Figure 27:
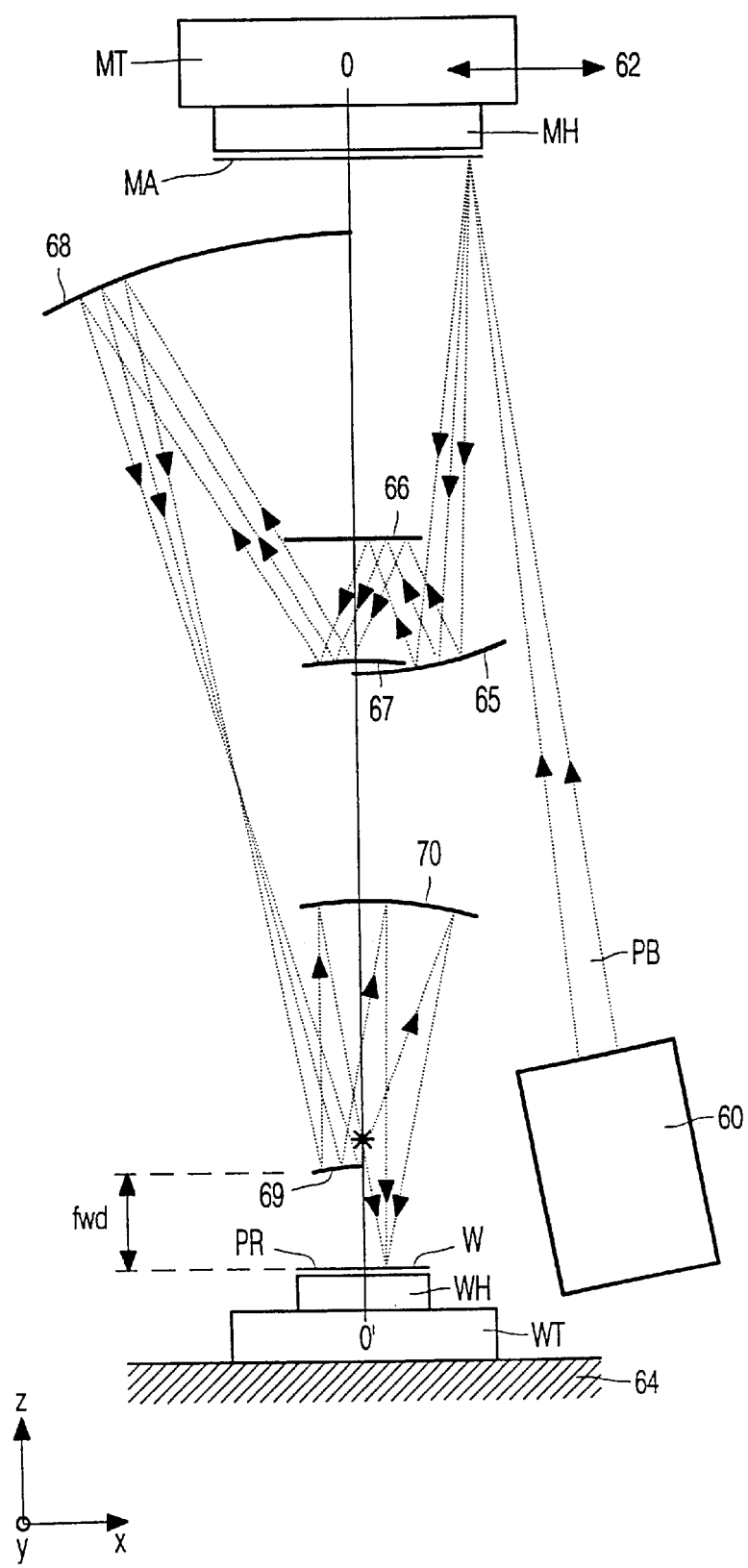
FIG. 27 shows an embodiment of a lithographic projection apparatus with a mirror projection system.

FIG. 27 shows an embodiment of another type of mirror projection system with six mirrors for a step-and-scanning lithographic projection apparatus having an NA (at the image side) of the order of 0.20, a magnification M of 0.25, a circular segment-shaped image field having a width of 1.5 mm and a relatively large free working distance fwd. The apparatus comprises an illumination unit 60, shown diagrammatically, accommodating an EUV radiation source and an optical system for forming a projection beam PB whose cross-section has the shape of a circular segment. As is shown in the Figure, the illumination unit may be positioned close to the substrate table WT and the imaging section 69, 70 of the projection system, so that the projection beam PB can enter the projection column closely along these elements. The mask MA' to be imaged, which is a reflective mask in this example, is arranged in a mask holder MH which forms part of a mask table MT by means of which the mask can be moved in the scanning direction 62 and possibly in a direction perpendicular to the scanning direction, such that all areas of the mask pattern can be arranged under the illumination spot formed by the projection beam PB. The mask holder and mask table are shown only diagrammatically and may be implemented in various ways. The substrate W is arranged on a substrate holder WH which is supported by a substrate table WT. This table may move the substrate in the scanning direction, the X direction, but also in the Y direction perpendicular thereto. In this embodiment, the mask and the substrate move in the same direction during scanning. The substrate table is supported by a block 64.

The projection beam reflected by the reflective mask MA is incident on a first mirror 65 which is concave. This mirror reflects the beam as a converging beam to a second mirror 66 which is slightly concave. The mirror 66 reflects the beam as a more strongly converging beam to a third mirror 67. This mirror is convex and reflects the beam as a slightly diverging beam to the fourth mirror 68. This mirror is concave and reflects the beam as a converging beam to the fifth mirror 69 which is convex and reflects the beam as a diverging beam to the sixth mirror 70. This mirror is concave and focuses on the photoresist layer PR provided on the substrate W. The mirrors 65, 66, 67 and 68 jointly form an intermediate image of the mask, and the mirrors 69 and 70 produce the desired telecentric image of this intermediate image on the photoresist layer PR.

Also the mirror projection system described above and other projection systems may have said aberrations: spherical aberration, coma, astigmatism, three-point aberration and possible further aberrations, and also these aberrations can be measured accurately and reliably by means of the novel method. In the EUV lithography, a reflective mask is preferably used, inter alia, because such a mask can be better supported than a transmissive mask. The test pattern required for the novel method in a reflective test mask or production mask must then have a depth which is equal to one quarter of the wavelength if the surrounding medium is air. This implies that a depth of 3.25 nm is necessary for the wavelength of 13 nm preferred in EUV lithography, which depth is very small. In that case, the FIG. 22 with the phase structure may also consist of an area in the plate or test mask 20 having a different refractive index than the rest of this plate.

As is apparent from the examples described above, the aberrations are relatively small for the measured lithographic projection systems. In practice, it is therefore as yet unnecessary to measure higher-order aberrations. However, as is apparent from the Fourier graphs of FIGS. 13, 17 and 21, the novel method is also suitable for measuring these higher-order aberrations.

The fact that the invention has been described with reference to the measurements on a projection lens system or a mirror projection system for a lithographic projection apparatus does not mean that its application is limited thereto. The invention may be used wherever the aberrations of an imaging system must be measured independently of each other and with great accuracy and reliability. An example of such an imaging system is a space telescope. When using the novel method in a lithographic projection apparatus, an optimal use is, however, made of the fact that this apparatus itself is already intended for imaging patterns on substrates and that the imaging and servosystems of this apparatus may also be used for performing the novel method. Moreover, possible means desired for performing the method, such as said extra diaphragm, can easily be arranged in the apparatus.

What is claimed is:

1. A test object which comprises at least one closed single figure having a phase structure, and means for subjecting the image of this figure observed by a scanning detection device to an image analysis in order to ascertain at least one of different types of changes of shape in the image of the single figure, each type of shape change being indicative of a given kind of aberration.

2. A test object as claimed in claim 1, implemented as a test mask, characterized in that each closed figure is surrounded by a figure area which is formed by a part of the mask surface area, which figure area has the same transmission or reflection coefficient as the figure.

3. A test object as claimed in claim 1 in which each figure area is surrounded by an outer area which is formed by a part of the mask surface area, characterized in that each outer area is provided with a recognition mark having the same transmission or reflection coefficient as the figure and the figure area.

4. A test object as claimed in claim 3, characterized in that each figure area is provided with navigation marks for the detection apparatus, which navigation marks have a different transmission or reflection coefficient than the figure and the figure area.

5. A test object as claimed in claim 3, characterized in that each outer area is provided with a further mark comprising information about the figure and/or its position on the mask surface area, said further mark having the same transmission or reflection coefficient as the figure and the figure area.

6. A test object as claimed in claim 2, characterized in that the test mask is transparent, and in that the surface area of this mask outside the figure and the figure area and outside the recognition mark and the further mark, if these are present, is provided with a radiation-obstructive layer.

7. A test object as claimed in claim 2, characterized in that the test mask is reflective, and in that the surface area of this mask outside the figure and the figure area and outside the recognition mark and the further mark, if these are present, is provided with a radiation-absorbing layer.

* * * * *